United States Patent
Ueda et al.

(10) Patent No.: US 6,746,948 B2
(45) Date of Patent: Jun. 8, 2004

(54) METHOD FOR FABRICATING SEMICONDUCTOR LIGHT-EMITTING DEVICE

(75) Inventors: Daisuke Ueda, Osaka (JP); Shinichi Takigawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/243,711

(22) Filed: Sep. 16, 2002

(65) Prior Publication Data

US 2003/0052326 A1 Mar. 20, 2003

(30) Foreign Application Priority Data

Sep. 17, 2001 (JP) .......................... 2001-281430

(51) Int. Cl.[7] .............................................. H01L 21/28
(52) U.S. Cl. ........................................ 438/604; 438/606
(58) Field of Search .................................. 438/602–606

(56) References Cited

U.S. PATENT DOCUMENTS 6,534,800 B1 * 3/2003 Ohbo et al. ................. 257/103

FOREIGN PATENT DOCUMENTS

| EP | 1 137 072 A2 | 9/2001 |
|---|---|---|
| JP | 2001-160658 | 6/2001 |
| JP | 2001-287555 | 9/2001 |
| JP | 2002-329863 | 11/2002 |

OTHER PUBLICATIONS

Hiroyuki Masato, et al., "Novel High Drain Brekdown Voltage AlGaN/GaN HFETs using Selective Thermal Oxidation Process", International Electron Devices Meeting, pp. 377–380, (Dec. 10, 2000).

Kaoru Inoue, et al., "Novel GaN–based MOS HFETs with Thermally Oxidized Gate Insulator", International Electron Meeting, pp. 577–580, (Dec. 2, 2001).

* cited by examiner

*Primary Examiner*—Jey Tsai
(74) *Attorney, Agent, or Firm*—McDermott, Will & Emery

(57) ABSTRACT

An n-type buffer layer composed of n-type GaN, an n-type cladding layer composed of n-type AlGaN, an n-type optical confinement layer composed of n-type GaN, a single quantum well active layer composed of undoped GaInN, a p-type optical confinement layer composed of p-type GaN, a p-type cladding layer composed of p-type AlGaN, and a p-type contact layer composed of p-type GaN are formed on a substrate composed of sapphire. A current blocking layer formed in an upper portion of the p-type cladding layer and on both sides of the p-type contact layer to define a ridge portion is composed of a dielectric material obtained by replacing some of nitrogen atoms composing a Group III–V nitride semiconductor with oxygen atoms.

2 Claims, 13 Drawing Sheets

METHOD FOR FABRICATING SEMICONDUCTOR LIGHT-EMITTING DEVICE

BACKGROUND OF THE INVENTION

The present invention relates to a semiconductor light-emitting device composed of a Group III–V nitride semiconductor which is capable of outputting light ranging in color from blue to ultraviolet and to a method for fabricating the same.

In recent years, semiconductor light-emitting devices each using a Group III–V nitride semiconductor represented by a general formula: $B_xAl_yGa_{1-x-y-z}In_zN$ (where x, y, and z satisfy $0 \leq x \leq 1$, $0 \leq y \leq 1$, $0 \leq z \leq 1$, x+y+z=1), i.e., a light-emitting diode device and a semiconductor laser device have been developed vigorously as light sources for emitting light ranging in color from blue to ultraviolet.

Referring to the drawings, a conventional semiconductor light-emitting device composed of a Group III–V nitride semiconductor will be described.

As shown in FIG. 13, an n-type contact layer 102 composed of n-type GaN, an n-type cladding layer 103 composed of n-type AlGaN, an active layer 104 composed of GaInN, a p-type cladding layer 105 composed of p-type AlGaN, and a p-type contact layer 106 composed of p-type GaN are formed successively on a substrate 101 composed of, e.g., sapphire by epitaxial growth.

A current blocking layer 107 composed of a silicon dioxide or a silicon nitride and having an opening 107a for current confinement is formed on the p-type contact layer 106. A p-side electrode 108 is formed on the portion of the p-type contact layer 106 exposed through the opening 107a of the current blocking layer 107.

As another method involving the provision of a current confining structure, there has been known one which confines a current path by removing, from a laser device structure, at least the both side portions of the p-type cladding layer 105 by etching.

In the conventional semiconductor light-emitting device, however, a silicon dioxide or silicon nitride is deposited by chemical vapor deposition or the like to form the current blocking layer 107 on the p-type contact layer 106. Each of the silicon dioxide and silicon nitride has the problems of poor adhesion to a group III–V nitride semiconductor, a high density of small holes, i.e., a high pinhole density, and the like.

If the current confining structure is formed by removing the both side portions of the cladding layer by etching, the electrode should be formed on the top surface of the ridge region (mesa region) formed by the etching process so that the area of the electrode is reduced. This causes the problem of an increased DC resistance component in a current path.

If the conventional semiconductor light-emitting device is a semiconductor laser device, recombined light generated in the active layer 104 is confined by the current blocking layer 107 composed of a dielectric material to the inside of the Group III–V nitride semiconductor due to a refractive index difference between the active layer 104 and the semiconductor. Since the refractive index difference is relatively large and varies discontinuously (stepwise), if the recombined light is to be confined in, e.g., a single lateral mode, the width of the opening 107a (stripe width) of the current blocking layer 107 is reduced excessively so that it becomes difficult to optimize the laser structure. If the stripe width is reduced excessively, the DC resistance component is increased disadvantageously as described above.

In addition, though not shown in the drawings, there are many cases observed where a conventional semiconductor laser device uses a cavity having a ridge structure. In a case with the ridge structure, the efficiency of the light confinement depends on a difference between a first refractive index inside the ridge region and a second refractive index in a region other than the ridge region. In detail, the first refractive index means a first effective refractive index determined according to each refractive index and each thickness of the semiconductor layer composing the active layer and of the semiconductor layer composing the cladding layer, and the second refractive index means a second effective refractive index determined according to each refractive index and each thickness of the semiconductor layer composing the active layer, the semiconductor layer composing the cladding layer and, for example, a silicon oxide layer or a silicon nitride layer composing the sides of the ridge structure. In the conventional ridge structure, the difference between the first refractive index and the second refractive index varies discontinuously (stepwise) and the step difference is rather large. Because of the large confinement efficiency, the light emitting point of the laser light may displace at a high power output and the configuration of the spot is liable to change when the light is confined in the cavity under this condition. For this reason, the design for optimizing the laser structure is rather difficult in equipment requiring accurate control of the light emitting point and the spot configuration, such as an optical laser disk device.

SUMMARY OF THE INVENTION

It is therefore an object of the present invention to solve the conventional problems and thereby improve the adhesion of a current blocking layer provided in a semiconductor light-emitting device composed of a Group III–V nitride semiconductor, while reducing a pinhole density therein.

To attain the object, a semiconductor light-emitting device according to the present invention comprises: a semiconductor cladding layer on a substrate; an active layer formed on the cladding layer; a semiconductor cladding layer formed on the active layer, the semiconductor cladding layer being composed of a Group III–V nitride; and a current blocking layer formed in the semiconductor layer to have an opening for exposing the semiconductor layer therethrough, the current blocking layer being composed of a dielectric material obtained by replacing some of nitrogen atoms composing the semiconductor layer with oxygen atoms.

In the semiconductor light-emitting device according to the present invention, the dielectric material obtained by replacing some of the nitrogen atoms composing the semiconductor layer composed of the group III–V nitride is used for the current blocking layer so that the current blocking layer is formed integrally with the semiconductor layer. This resolves the problem of the current blocking layer associated with the adhesion thereof to the semiconductor layer and significantly reduces the pinhole density.

In the semiconductor light-emitting device according to the present invention, a composition of oxygen in the current blocking layer preferably decreases gradually with approach to the active layer.

In the arrangement, the composition of oxygen in the semiconductor layer increases gradually with distance from the inside of the semiconductor layer toward the outside thereof so that the refractive index difference between the semiconductor layer and the current blocking layer changes continuously. This allows an increase in the width of an opening in the current blocking layer for effecting single lateral mode confinement if the semiconductor light-emitting device is, e.g., a laser device and permits easy optimization of the laser structure.

In the semiconductor light-emitting device according to the present invention, the opening of the current blocking layer preferably has a stripe plan configuration.

In that case, the semiconductor layer preferably has a ridge portion composing a cavity and the current blocking layer is formed also on side portions of the semiconductor layer.

In the semiconductor light-emitting device according to the present invention, the opening of the current blocking layer preferably has a dot plan configuration.

A method for fabricating a semiconductor light-emitting device according to the present invention comprises: a first step of forming an active layer and a cladding layer on a substrate; a second step of forming, on the active layer, a semiconductor layer composed of a Group III–V nitride; a third step of selectively forming, on the semiconductor layer, a mask film for partially masking the semiconductor layer; a fourth step of oxidizing the semiconductor layer with the mask film formed thereon in an oxidizing atmosphere to form, in the semiconductor layer, a current blocking layer composed of a dielectric material obtained by replacing some of nitrogen atoms composing the semiconductor layer with oxygen atoms; and a fifth step of removing the mask film.

In accordance with the method for fabricating a semiconductor light-emitting device according to the present invention, the semiconductor layer composed of a Group III–V nitride is formed on the active layer and the mask film is formed selectively thereon. The semiconductor layer is then oxidized by using the formed mask film to form the current blocking layer composed of a dielectric material obtained by replacing some of the nitrogen atoms composing the semiconductor layer with oxygen atoms. This prevents a problem associated with the adhesion between the current blocking layer and the semiconductor layer. Since some of the nitrogen atoms composing the semiconductor layer have been replaced with oxygen atoms which are larger in atomic radius than the nitrogen atoms, the volume of the semiconductor layer is increased so that a pinhole density in the current blocking layer is reduced significantly.

Preferably, the method for fabricating a semiconductor light-emitting device further comprises, between the third and fourth steps: a sixth step of patterning the semiconductor layer into a ridge configuration by using the mask.

DETAILED DESCRIPTION OF THE INVENTION

Embodiment 1

A first embodiment of the present invention will be described with reference to the drawings.

Figure 1:
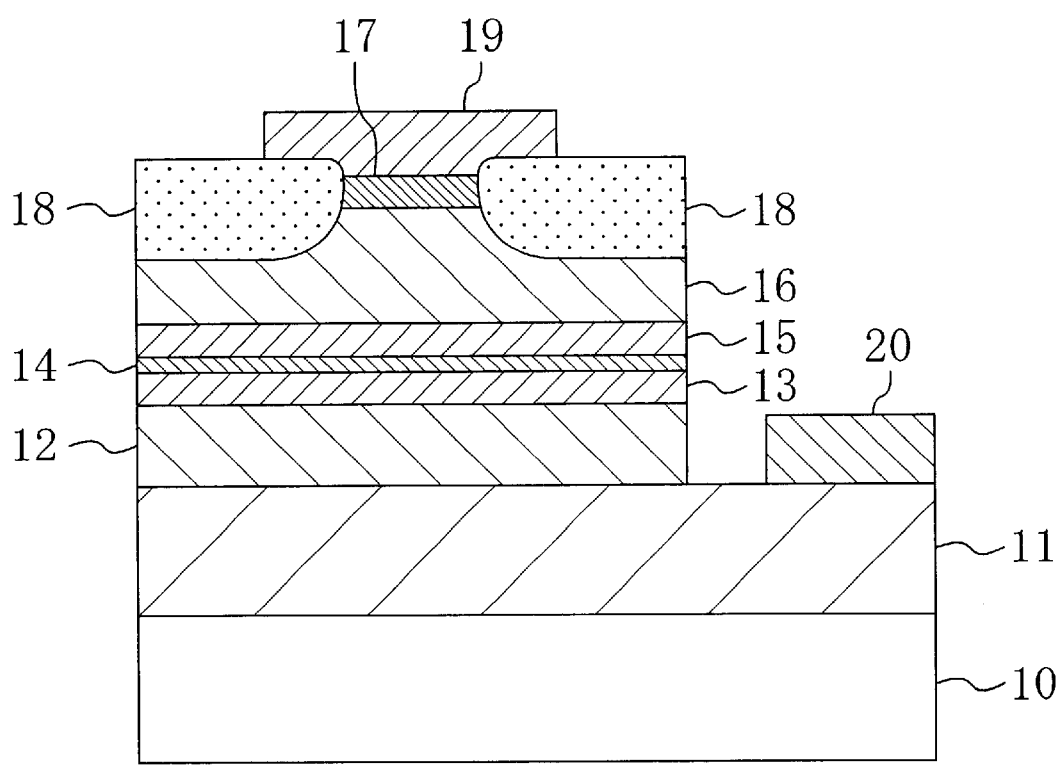
FIG. 1 is a structural cross-sectional view of a semiconductor laser device according to a first embodiment of the present invention.

FIG. 1 shows a cross-sectional structure of a semiconductor laser device according to the first embodiment.

The semiconductor laser device shown in FIG. 1 has a double heterostructure including cladding layers composed of an aluminum gallium nitride (AlGaN) having a relatively large band gap and a quantum well layer and the like composed of any of a gallium nitride (GaN), a gallium indium nitride (GaInN), and a combination thereof, each having a band gap smaller than that of the cladding layers, which are sandwiched between the cladding layers. A description will be given herein below to the case where a single quantum well separate confinement heterostructure (SQW—SCH) is used.

As shown in FIG. 1, an n-type buffer layer 11 composed of n-type GaN with a thickness of about 2 $\mu$m, an n-type cladding layer 12 composed of n-type $Al_{0.15}Ga_{0.85}N$ with a thickness of about 1 $\mu$m, an n-type optical confinement layer 13 composed of n-type GaN with a thickness of about 0.1 $\mu$m, a single quantum well active layer 14 composed of undoped $Ga_{0.8}In_{0.2}N$ with a thickness of about 5 nm, a p-type optical confinement layer 15 composed of p-type GaN with a thickness of about 0.1 $\mu$m, a p-type cladding layer 16 composed of p-type $Al_{0.15}Ga_{0.85}N$ with a thickness of about 1 $\mu$m, and a p-type contact layer 17 composed of p-type GaN with a thickness of about 0.5 $\mu$m are formed successively on a substrate 10 composed of sapphire (single-crystal $Al_2O_3$) by crystal growth.

In the structure, the n-type buffer layer 11 alleviates lattice mismatching between sapphire composing the substrate 10 and each of the semiconductor layers 12 to 17 grown epitaxially on the substrate 10, while functioning as a contact layer for an n-side electrode 20.

The n-type cladding layer 12 and the p-type cladding layer 16 confine carriers injected from the n-side electrode 20 and a p-side electrode 19, respectively, while confining recombined light of the carriers. The n-type optical confinement layer 13 and the p-type optical confinement layer 15 are provided to improve the efficiency with which the recombined light is confined.

The first embodiment is characterized in that a current blocking layer 18 composed of a dielectric material obtained by replacing some of nitrogen atoms composing the p-type cladding layer 16 and the p-type contact layer 17 with oxygen atoms is formed in an upper portion of the p-type cladding layer 16 in mutually spaced apart relation and on both sides of the p-type contact layer 17. The current blocking layer 18 is formed such that the p-type cladding layer 16 and the p-type contact layer 17 form a mesa-like ridge structure having a stripe plan configuration. The upper part of the ridge portion has a width of about 2 μm, while the lower part thereof has a width of about 3 μm.

The p-side electrode 19 composed of a multilayer structure of nickel (Ni), platinum (Pt), and gold (Au) is formed on the p-type contact layer 17 to make an ohmic contact therewith. The n-side electrode 20 composed of a multilayer structure of titanium (Ti), platinum (Pt), and gold (Au) is formed on the exposed region of the n-type buffer layer 11 to make an ohmic contact with the n-type buffer layer 11.

Thus, the semiconductor laser device according to the first embodiment is a so-called edge-emitting laser having a cavity using the both end surfaces of the ridge structure as cleaved mirror surfaces. The cavity extends in a direction perpendicular to the cross section of the semiconductor layer in FIG. 1 (front-to-rear direction).

A description will be given to a method for fabricating the semiconductor laser device thus constructed with reference to the drawings.

FIGS. 2A to 2D show cross-sectional structures of the semiconductor laser device according to the first embodiment in the individual steps of the fabrication method therefor. In FIG. 2, the same components as shown in FIG. 1 are designated by the same reference numerals.

Figure 2A:
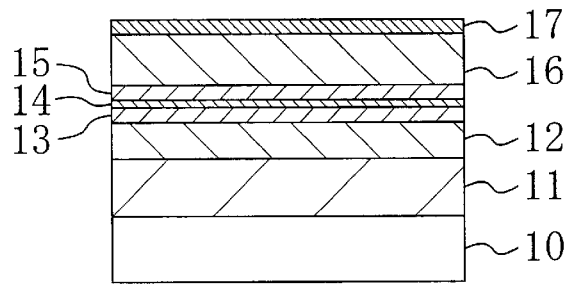
FIGS. 2A to 2D are structural cross-sectional views illustrating the individual process steps of a method for fabricating the semiconductor laser device according to the first embodiment.

First, as shown in FIG. 2A, the n-type buffer layer 11, the n-type cladding layer 12, the n-type optical confinement layer 13, the single quantum well active layer 14 (hereinafter referred to as the active layer 14), the p-type optical confinement layer 15, the p-type cladding layer 16, and the p-type contact layer 17 are grown successively on the substrate 10 composed of sapphire by, e.g., metal organic vapor phase epitaxy (MOVPE), thereby forming epitaxial layers. In the present embodiment, silicon (Si) is used as an n-type dopant and magnesium is used as a p-type dopant.

Figure 2B:
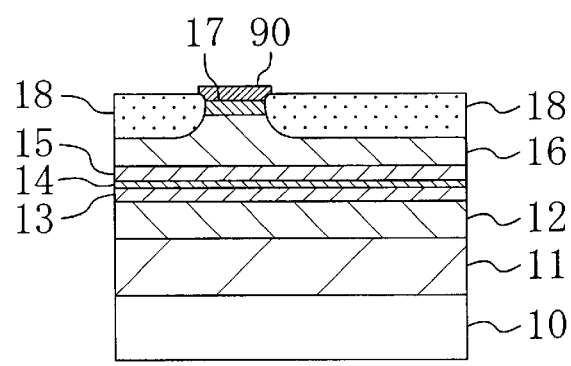

Next, as shown in FIG. 2B, a polysilicon film with a thickness of about 500 nm is deposited on the p-type contact layer 17 by, e.g., CVD. Subsequently, a stripe resist pattern (not shown) with a width of about 3 μm is formed by lithography to cover the region of the p-type contact layer 17 to be formed with the cavity. By using the formed resist pattern as a mask, dry etching using tetrafluorocarbon ($CF_4$) as an etching gas is performed with respect to the polysilicon film, thereby forming an anti-oxidant film 90 from the polysilicon film. By using the formed anti-oxidant film 90 as a mask, the epitaxial layer is subsequently exposed to an oxygen atmosphere at a temperature of about 900° C. and under a pressure of about 1 atm for about 24 hours, whereby the upper portion of the p-type cladding layer 16 and the portions of the p-type contact layer 17 located on both sides of the anti-oxidant film 90 are oxidized. As a result, some of the nitrogen atoms composing the p-type cladding layer 16 and the p-type contact layer 17 are replaced with oxygen atoms so that the current blocking layer 18 is formed in the upper portion of the p-type cladding layer 16 and in the portions of the p-type contact layer 17 located on both sides of the anti-oxidant film 90.

The first embodiment is characterized in that the concentration distribution of oxygen in the current blocking layer 18 has a profile gradually decreasing with distance from the surface of the current blocking layer 18 to the inside thereof.

Figure 2C:
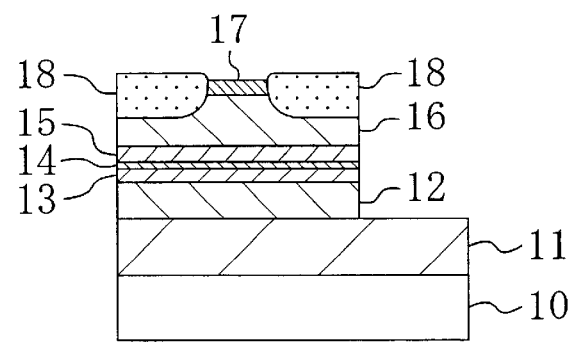

Next, as shown in FIG. 2C, the anti-oxidant film 90 is removed by immersing the epitaxial layer in a buffered hydrofluoric acid which is a solution mixture of a hydrofluoric acid (HF) and an ammonium fluoride ($NH_4F$). The residual portion of the anti-oxidant film 90 is removed by dry etching using tetrafluorocarbon, while the current blocking layer 18 formed is not etched by the buffered hydrofluoric acid. Thereafter, a resist pattern (not shown) for masking the portion of the epitaxial layer including the cavity formation region is formed by lithography. By using the formed resist pattern as a mask, dry etching using chlorine ($Cl_2$) is performed with respect to the epitaxial layer, thereby exposing the n-type buffer layer 11.

Figure 2D:
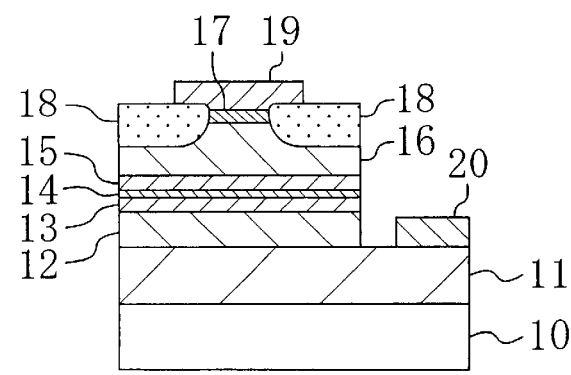

Next, as shown in FIG. 2D, nickel, platinum, and gold are deposited successively on the p-type contact layer 17 by, e.g., vapor deposition so that the p-side electrode 19 composed of the resulting multilayer structure is formed selectively. Subsequently, titanium, platinum, and gold are deposited successively on the exposed portion of the n-type buffer layer 11 so that the n-side electrode 20 composed of the resulting multilayer structure is formed selectively. The order in which the p-side electrode 19 and the n-side electrode 20 are formed may also be reversed.

Thereafter, the substrate 10 is cleaved such that the cavity has a length of about 500 μm and the emitting edge surface of the cavity is provided with low reflection coating to have a reflectivity of about 10%, while the reflecting edge surface of the cavity is provided with high reflection coating to have a reflectivity of about 80%, though the foregoing processes are not depicted.

In accordance with the fabrication method of the first embodiment, the current blocking layer 18 is formed from a dielectric material obtained by replacing some of the nitrogen atoms composing the p-type cladding layer 16 and the p-type contact layer 17 with oxygen atoms. Consequently, the adhesion of the current blocking layer 18 to the p-type cladding layer 16 and to the p-type contact layer 17 is improved significantly, which is different from a conventional current blocking layer composed of a different material such as a silicon dioxide or a silicon nitride. In addition, the density of pinholes occurring in the current blocking layer 18 is also reduced greatly since the silicon dioxide ($SiO_2$) or silicon nitride ($Si_3N_4$) is not used.

Moreover, the amount of oxygen contained in the current blocking layer 18 decreases gradually with approach to the active layer 14. This allows the refractive index of the current blocking layer 18 to change continuously and increases, e.g., the stripe width (ridge width) for achieving single lateral mode confinement, thereby easily optimizing the laser structure.

Furthermore, the fabrication method according to the first embodiment allows the current blocking layer 18 to have a light confining function and a current confining function by self alignment.

The following is the two functions of the current blocking layer 18.

The first one is the current confining function. Because of its insulating property, the dielectric layer hardly allows a current to flow therethrough. As a result, the current injected in the semiconductor laser device flows through the mesa portion (ridge portion) only into the light-emitting portion of the active layer 14. As a result, an ineffective current is reduced and the value of a threshold current for laser oscillation is reduced.

The second one is the light confining function. The p-type cladding layer 16 and the current blocking layer 18 have a refractive index difference therebetween. The refractive index difference confines the light in the semiconductor laser device to the ridge portion so that the light is coupled efficiently to induced emission in the active layer 14.

As described above, the conventional current blocking layer composed of a silicon dioxide or a silicon nitride has a large refractive index difference of about 0.5 to 1 between itself and the epitaxial layer, which changes discontinuously. The conventional current blocking layer has too large a refractive index difference if it is used to control a lateral mode in a semiconductor laser device. With slight variations in ridge configuration, e.g., a far field pattern causes a higher-order lateral mode so that it is difficult to use the semiconductor laser device as a light source for an optical apparatus.

By contrast, the current blocking layer (dielectric layers) 18 according to the first embodiment is composed of a material obtained by thermally diffusing oxygen from the surface of the epitaxial layer and replacing some of the nitrogen atoms composing the p-type cladding layer 16 and the p-type contact layer 17 with oxygen atoms. The current blocking layer 18 thus formed has a refractive index difference between itself and the p-type cladding layer 16 which is small and changes gradually so that the lateral mode in the semiconductor laser device is controlled easily The present inventors measured the composition of oxygen contained in the current blocking layer 18 by secondary ion mass spectroscopy (SIMS) and verified that the composition of oxygen changes as a quadratic curve. Specifically, the concentration of oxygen in the near surface region of the current blocking layer 18 is about $1 \times 10^{20}$ cm$^{-3}$ and the concentration of oxygen in the region of the current blocking layer 18 at a depth of about 1 μm from the surface thereof is about $1 \times 10^{18}$ cm$^{-3}$. It was verified that, as the composition of oxygen in the current blocking layer 18 changed as a quadratic curve, the refractive index of the current blocking layer 18 also decreased gradually as a quadratic curve toward the outside thereof, which was about 2.1 in the ridge portion and about 1.6 in the near surface region of the current blocking layer 18 with a small difference of about 0.5 therebetween. This alleviates confinement of the light to the ridge portion and allows steady lateral mode oscillation.

Figure 3:
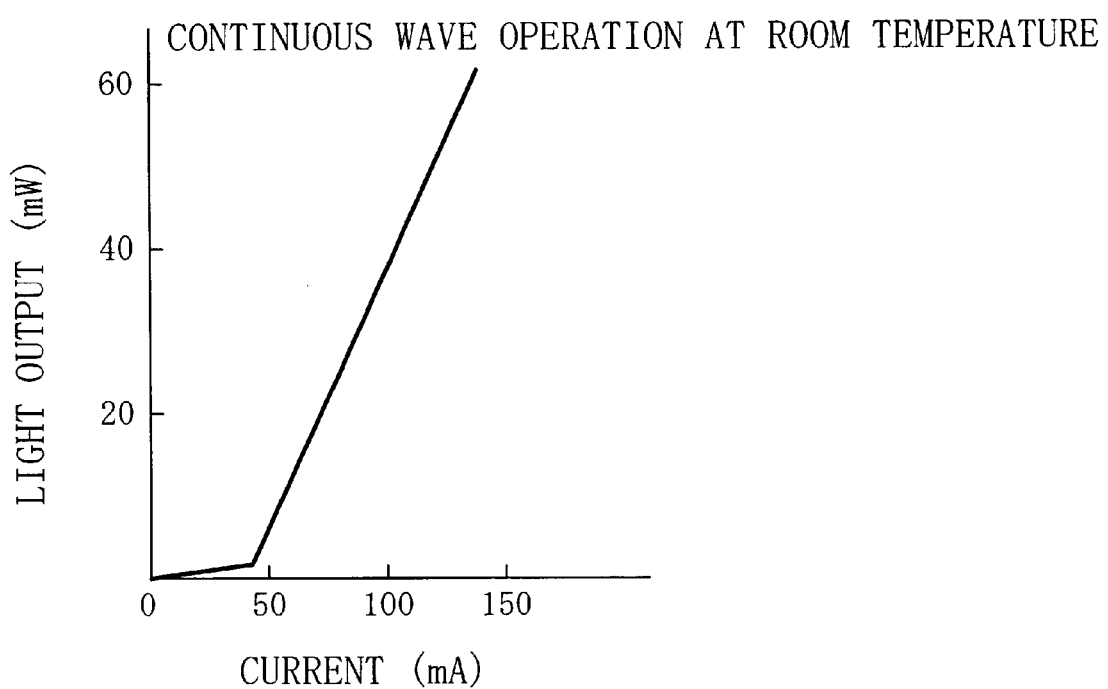
FIG. 3 is a graph showing the relationship between injected current and light output in the semiconductor laser device according to the first embodiment.

FIG. 3 shows the relationship between injected current and light output in the semiconductor laser device according to the first embodiment. The oscillation wavelength is 410 nm, while the threshold current and threshold voltage are 40 mA and 4.2 V. The maximum light output is 60 mW. Thus, the current blocking layer 18 composed of a dielectric material obtained by replacing some of the nitrogen atoms composing the p-type cladding layer 16 and the p-type contact layer 17 with oxygen atoms has increased the current confinement efficiency and the light confinement efficiency and thereby implemented a reduced threshold current and a high output operation.

Figure 4:
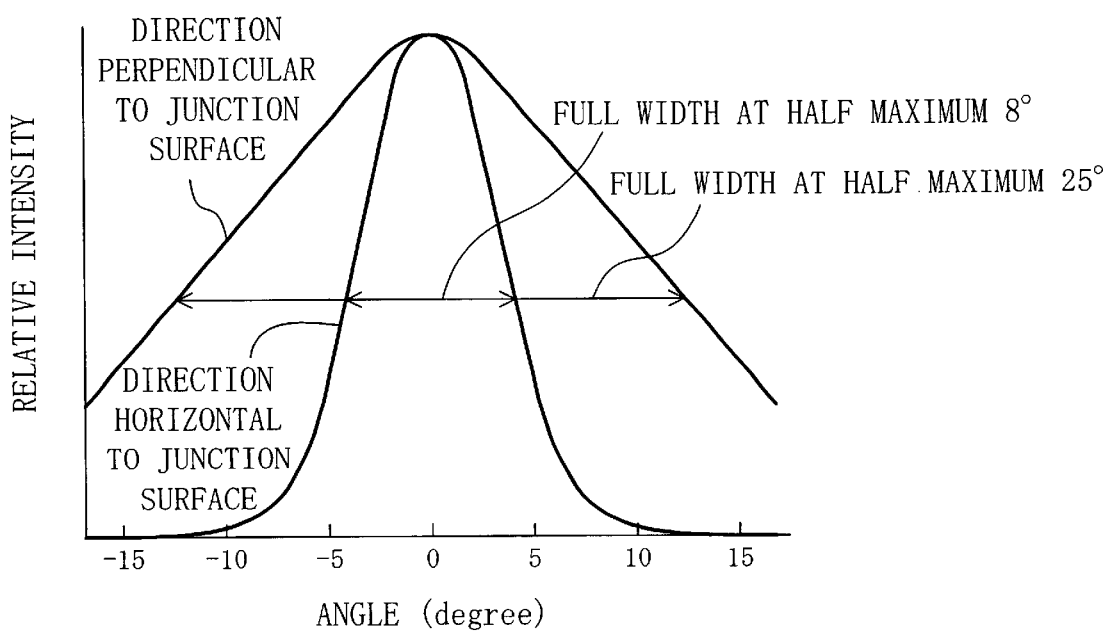
FIG. 4 is a graph showing a far field pattern in the semiconductor laser device according to the first embodiment.

In addition, as shown in FIG. 4, the half width of a far field pattern when the output is 20 mW is at an angle of 8° with respect to a direction parallel with the junction surface (substrate surface) and at an angel of 25° with respect to a direction perpendicular to the junction surface.

Figure 5:
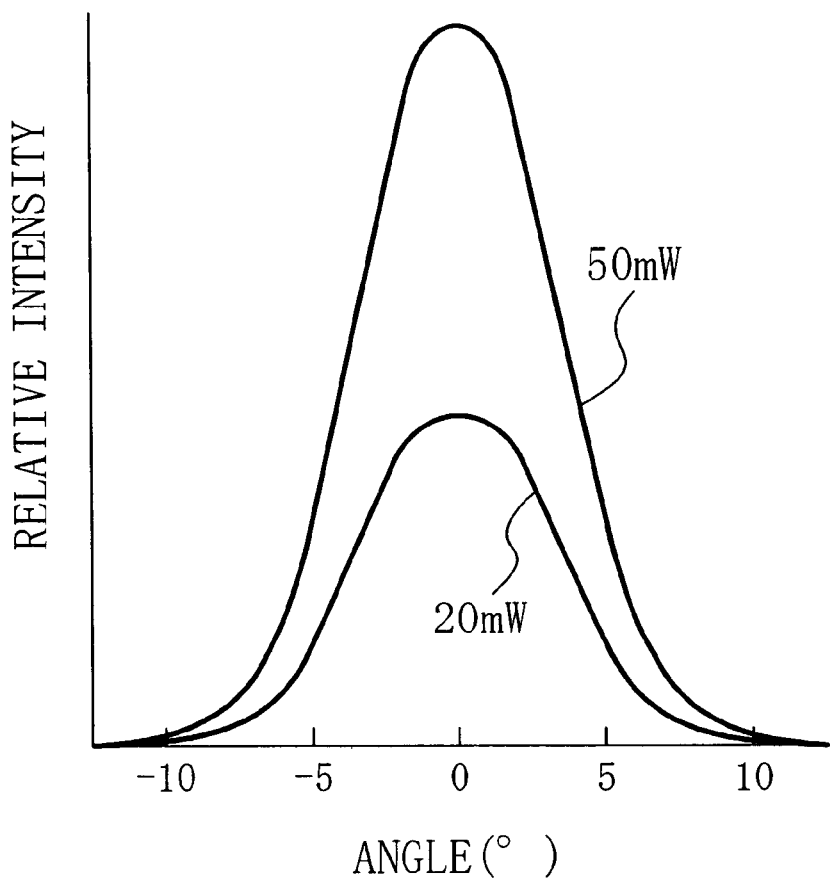
FIG. 5 is a graph showing the dependence of far field pattern on light output in a direction parallel to the junction surface of the semiconductor laser device according to the first embodiment.
Figure 6:
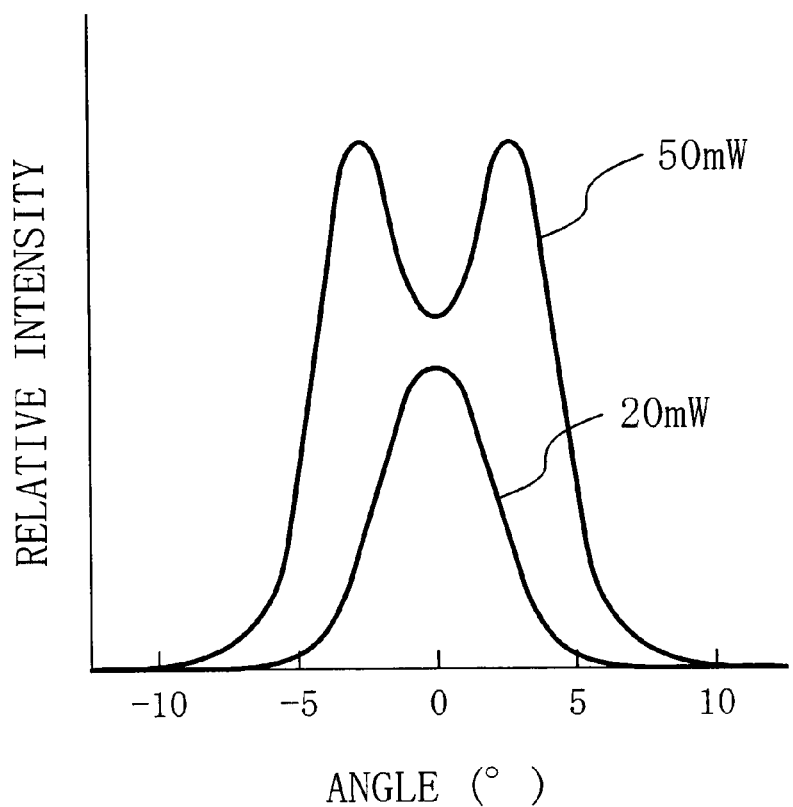
FIG. 6 is a graph showing the dependence of far field pattern on light output in a direction parallel to the junction surface of a conventional semiconductor laser device.

FIG. 5 shows the dependence of the far field pattern on the light output in a direction parallel with the junction surface of the semiconductor laser device having the current blocking layer 18 according to the first embodiment. FIG. 6 is for comparison and shows the light output characteristic of a far field pattern in a direction parallel with the junction surface of a semiconductor laser device having a current blocking layer composed of a silicon nitride according to a conventional embodiment. The light outputs are 20 mW and 50 mW in each of FIGS. 5 and 6.

In the laser device according to the conventional embodiment, a refractive index difference at the interface between the ridge portion and the current blocking layer is about 0.9 and the refractive index changes discontinuously at the interface. To obtain fundamental lateral mode oscillation in a direction perpendicular to the junction surface, an effective refractive index difference is reduced by increasing the distance between the lower part of the ridge portion and the active layer. In such a structure, however, the injected current expands in the vicinity of the active layer. This not only increases the value of the threshold current but also renders the confinement of recombined light unsteady. If the light output value is increased to 50 mW as shown in FIG. 6, the relative intensity has two peaks so that a so-called double-humped far field pattern is observed.

In the laser device according to the first embodiment shown in FIG. 5, by contrast, the relative intensity has one peak even if the output value is 20 mW or 50 mW so that a single-humped far field pattern is observed.

Figure 7:
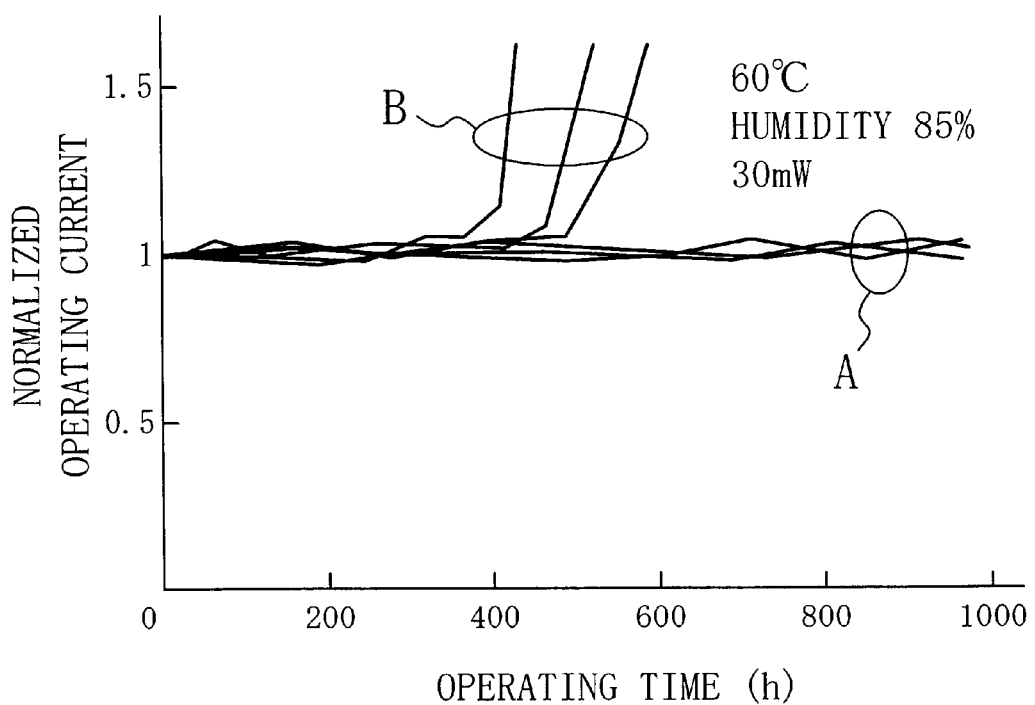
FIG. 7 is a graph showing the results of high-temperature high-humidity life tests conducted on the semiconductor laser device according to the first embodiment and on the conventional semiconductor laser device.

FIG. 7 shows the result of a high-temperature high-humidity life test conducted on the semiconductor laser device according to the first embodiment. The life test was conducted under conditions such that the output was 30 mW, the temperature was 60° C., and the humidity was 85%. In FIG. 7, the abscissa axis represents an operating time and the coordinate axis represents an operating current normalized by assuming that the operating current immediately after the initiation of operation was 1. The curves A were obtained from the semiconductor laser device according to the present invention, while the curves B were obtained from the semiconductor laser device according to the conventional embodiment. As shown in FIG. 7, since the adhesion of the current blocking layer composed of a silicon nitride to the ridge portion is poor in the conventional embodiment, peeling off proceeds at the current blocking layer. This changes the distribution of refractive indices and causes higher-order lateral mode oscillation. Consequently, the coupling of laser light to induced emission in the active layer is weakened and the value of the threshold current increases to cause drastic degradation.

In the semiconductor laser device according to the present invention, the current blocking layer is formed by partly oxidizing the p-type cladding layer 16 and the p-type contact layer 17 composing the ridge portion instead of using a dielectric material other than that composing the ridge portion to compose the current blocking layer. Since the adhesion to the ridge portion is remarkably excellent, peeling off is seldom observed so that steady operation is performed over a long period.

Although the description has been given to the case where the semiconductor light-emitting device is the semiconductor laser device, the current blocking layer according to the present invention is also applicable to a light-emitting diode device, similarly to the semiconductor laser device, in terms of the current confining function and the light confining function.

Although the edge-emitting laser device has been described as an example of the semiconductor laser device, the present invention is also applicable to a surface-emitting laser device.

Embodiment 2

A second embodiment of the present invention will be described herein below with reference to the drawings.

Figure 8:
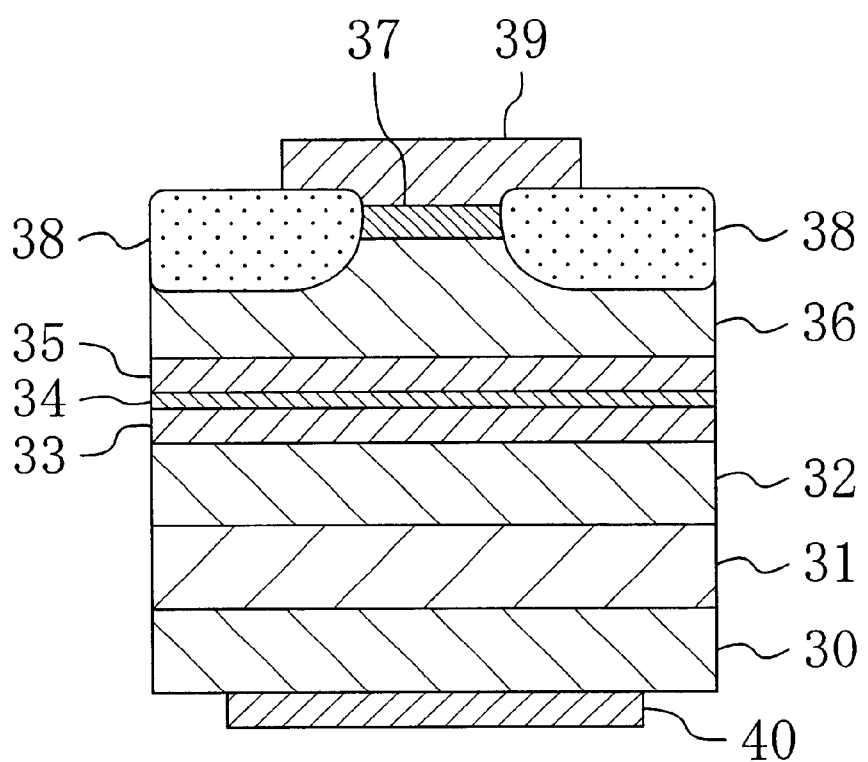
FIG. 8 is a structural cross-sectional view of a semiconductor laser device according to a second embodiment of the present invention.

FIG. 8 shows a cross-sectional structure of a semiconductor laser device according to the second embodiment.

In contrast to the first embodiment which uses insulating sapphire to compose the substrate 10 on which the epitaxial layer is grown, the second embodiment uses, to compose a substrate 30, any of an n-type gallium nitride (GaN), an n-type aluminum gallium nitride (AlGaN), and an n-type silicon carbide (SiC) each having conductivity and close in lattice constant to a Group III nitride semiconductor, as shown in FIG. 8.

As shown in FIG. 8, an n-type buffer layer 31 composed of n-type GaN with a thickness of about 2 $\mu$m, an n-type cladding layer 32 composed of n-type $Al_{0.15}Ga_{0.85}N$ with a thickness of about 1 $\mu$m, an n-type optical confinement layer 33 composed of n-type GaN with a thickness of about 0.1 $\mu$m, a single quantum well active layer 34 composed of undoped $Ga_{0.8}In_{0.2}N$ with a thickness of about 5 nm, a p-type optical confinement layer 35 composed of p-type GaN with a thickness of about 0.1 $\mu$m, a p-type cladding layer 36 composed of p-type $Al_{0.15}Ga_{0.85}N$ with a thickness of about 1 $\mu$m, and a p-type contact layer 37 composed of p-type GaN with a thickness of about 0.5 $\mu$m are formed successively on the substrate 30 composed of, e.g., the n-type gallium nitride (GaN) by crystal growth.

In the second embodiment also, a current blocking layer 38 composed of a dielectric material obtained by replacing some of nitrogen atoms composing the p-type cladding layer 36 and the p-type contact layer 37 with oxygen atoms is formed in an upper portion of the p-type cladding layer 36 in mutually spaced apart relation and on both sides of the p-type contact layer 37. The current blocking layer 38 is formed such that the p-type cladding layer 36 and the p-type contact layer 37 form a ridge-like ridge structure having a stripe plan configuration. The upper part of the ridge portion has a width of about 2 $\mu$m, while the lower part thereof has a width of about 3 $\mu$m.

A p-side electrode 39 composed of a multilayer structure of nickel, platinum, and gold is formed on the p-type contact layer 37 to make an ohmic contact therewith. An n-side electrode 40 composed of a multilayer structure of titanium, platinum, and gold is formed on the surface of the substrate 30 opposite to the n-type buffer layer 31.

A description will be given to a method for fabricating the semiconductor laser device thus constructed with reference to the drawings.

FIGS. 9A to 9E show cross-sectional structures of the semiconductor laser device according to the second embodiment in the individual steps of the fabrication method therefor. In FIG. 9, the same components as shown in FIG. 8 are designated by the same reference numerals.

Figure 9A:
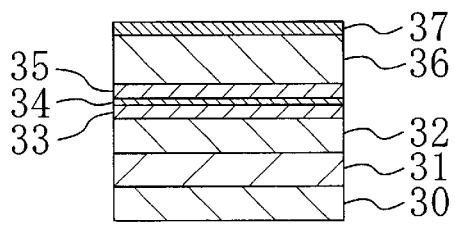
FIGS. 9A to 9E are structural cross-sectional views illustrating the individual process steps of a method for fabricating the semiconductor laser device according to the second embodiment.
Figure 9B:
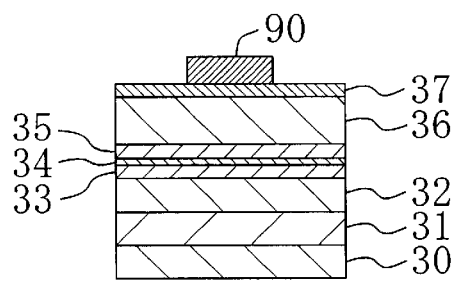

First, as shown in FIG. 9A, the n-type buffer layer 31, the n-type cladding layer 32, the n-type optical confinement layer 33, the single quantum well active layer 34 (hereinafter referred to as the active layer 34), the p-type optical confinement layer 35, the p-type cladding layer 36, and the p-type contact layer 37 are grown successively on the substrate 30 composed of a gallium nitride by, e.g., MOVPE, thereby forming epitaxial layers. Next, as shown in FIG. 9B, a polysilicon film with a thickness of about 500 nm is deposited on the p-type contact layer 37 by, e.g., CVD. Subsequently, a stripe resist pattern (not shown) with a width of about 3 $\mu$m is formed by lithography to cover the region of the p-type contact layer 37 to be formed with the cavity. By using the formed resist pattern as a mask, dry etching using tetrafluorocarbon as an etching gas is performed with respect to the polysilicon film, thereby forming an anti-oxidant film 90 from the polysilicon film.

Figure 9C:
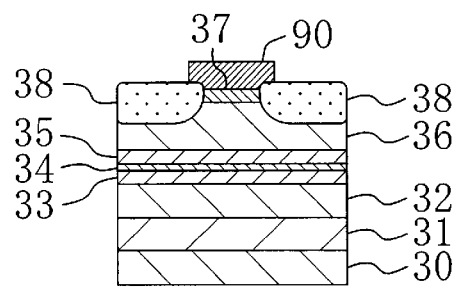

Next, as shown in FIG. 9C, the epitaxial layer is exposed to an oxygen atmosphere at a temperature of about 900° C. and under a pressure of about 1 atm for about 24 hours by using the formed anti-oxidant film 90 as a mask, whereby the upper portion of the p-type cladding layer 36 and the portions of the p-type contact layer 37 located on both sides of the anti-oxidant film 90 are oxidized. As a result, some of the nitrogen atoms composing the p-type cladding layer 36 and the p-type contact layer 37 are replaced with oxygen atoms so that the current blocking layer 38 is formed in the upper portion of the p-type cladding layer 36 and in the portions of the p-type contact layer 37 located on both sides of the anti-oxidant film 90. In the second embodiment also, the concentration distribution of oxygen in the current blocking layer 38 has a profile gradually decreasing with distance from the surface of the current blocking layer 38 to the inside thereof.

Figure 9D:
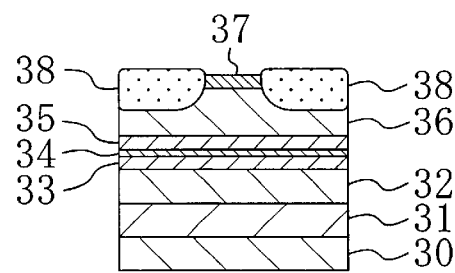

Next, as shown in FIG. 9D, the anti-oxidant film 90 is removed by immersing the epitaxial layer in a buffered hydrofluoric acid. The residual portion of the anti-oxidant film 90 is removed by dry etching using tetrafluorocarbon, while the current blocking layer 38 formed is not etched by the buffered hydrofluoric acid.

Figure 9E:
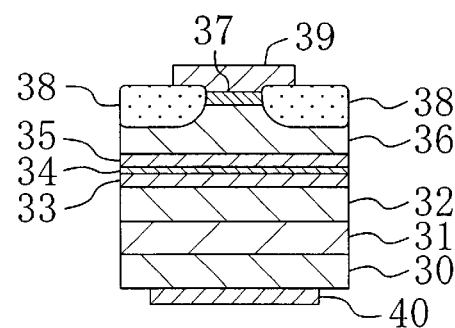

Next, as shown in FIG. 9E, nickel, platinum, and gold are deposited successively by, e.g., vapor deposition in such a manner as to cover the p-type contact layer 37 so that the p-side electrode 39 composed of the resulting multilayer structure is formed selectively. Subsequently, titanium, platinum, and gold are deposited successively on the surface of the substrate 30 opposite to the n-type buffer layer 31 so that the n-side electrode 40 composed of the resulting multilayer structure is formed selectively. In the present embodiment also, the order in which the p-side electrode 39 and the n-side electrode 40 are formed may also be reversed.

Thereafter, the substrate 30 is cleaved such that the cavity has a length of about 500 $\mu$m and the emitting surface of the cavity is provided with low reflection coating to have a reflectivity of about 10%, while the reflecting surface of the cavity is provided with high reflection coating to have a reflectivity of about 80%, though the foregoing processes are not depicted.

Thus, in the semiconductor laser device according to the second embodiment and the fabrication method therefor, the current blocking layer 38 is formed from a dielectric material obtained by replacing some of the nitrogen atoms composing the p-type cladding layer 36 and the p-type contact layer 37 with oxygen atoms. Accordingly, the adhesion of the current blocking layer 38 to the p-type cladding layer 36 and to the p-type contact layer 39 is improved significantly In addition, the amount of oxygen contained in the current blocking layer 38 decreases gradually with approach to the active layer 34. This allows the refractive index of the current blocking layer 38 to change continuously and easily optimizes the laser structure.

Moreover, the n-side electrode 40 is provided on the surface of the substrate 30 opposite to the n-type buffer layer 31 in opposing relation to the p-side electrode 39. This obviates the necessity for an etching step as performed in the first embodiment with respect to the epitaxial layer to expose the n-type buffer layer 31. As a consequence, the production yield is further improved than in the first embodiment.

The second embodiment is not only applicable to an edge-emitting laser device but also to a surface-emitting laser device, similarly to the first embodiment.

Embodiment 3

A third embodiment of the present invention will be described herein below with reference to the drawings.

Figure 10:
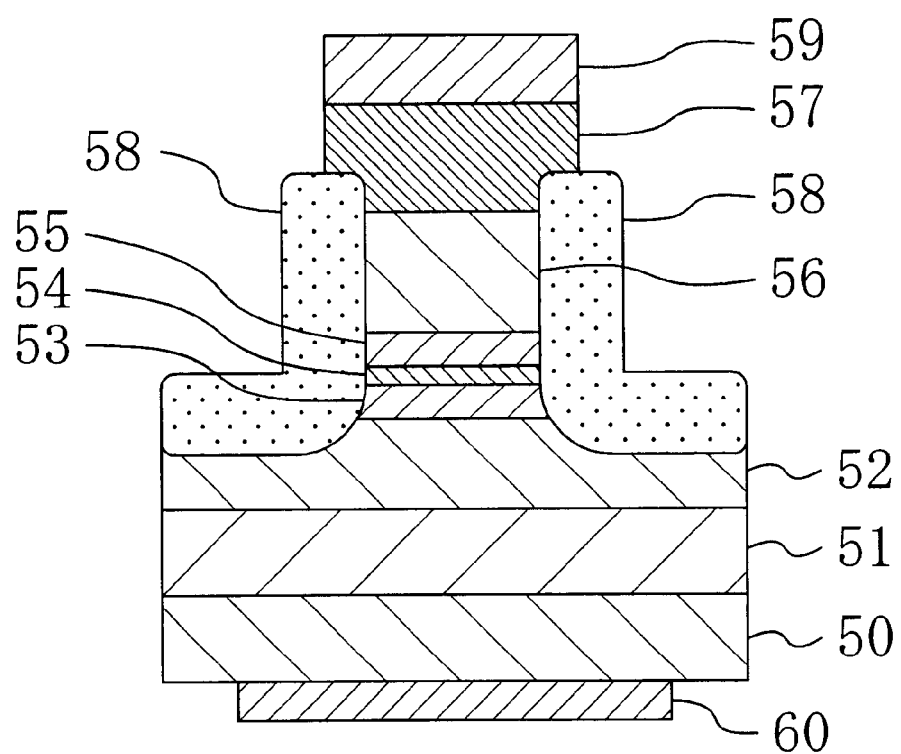
FIG. 10 is a structural cross-sectional view of a semiconductor laser device according to a third embodiment of the present invention.

FIG. 10 shows a cross-sectional structure of a semiconductor laser device according to the third embodiment.

A structure according to the third embodiment is obtainable by further improving the light confining efficiency of the ridge structure of the semiconductor laser device described in the second embodiment.

As shown in FIG. 10, an n-type buffer layer 51 composed of n-type GaN with a thickness of about 2 μm, an n-type cladding layer 52 composed of n-type $Al_{0.15}Ga_{0.85}N$ with a thickness of about 1 μm, an n-type optical confinement layer 53 composed of n-type GaN with a thickness of about 0.1 μm, a single quantum well active layer 54 composed of undoped $Ga_{0.8}In_{0.2}N$ with a thickness of about 5 nm, a p-type optical confinement layer 55 composed of p-type GaN with a thickness of about 0.1 μm, a p-type cladding layer 56 composed of p-type $Al_{0.15}Ga_{0.85}N$ with a thickness of about 1 μm, and a p-type contact layer 57 composed of p-type GaN with a thickness of about 0.5 μm are formed successively on the substrate 50 composed of, e.g., an n-type gallium nitride (GaN) by crystal growth. A material composing the substrate 50 is not limited to a gallium nitride. Instead, an n-type AlGaN or SiC may also be used to compose the substrate 50.

The third embodiment is characterized in that a region extending from the p-type contact layer 57 to the upper portion of the n-type cladding layer 52 has its both side portions etched to form a mesa portion (ridge portion) having a width of about 2 μm. A current blocking layer 58 composed of a dielectric material obtained by replacing some of nitrogen atoms composing the region extending from the p-type contact layer 57 to the n-type cladding layer 52 with oxygen atoms is formed on both sides of the ridge portion.

A p-side electrode 59 composed of a multilayer structure of nickel, platinum, and gold is formed on the p-type contact layer 57 to make an ohmic contact therewith. An n-side electrode 60 composed of a multilayer structure of titanium, platinum, and gold is formed on the surface of the substrate 50 opposite to the n-type buffer layer 51.

Although the p-side electrode 59 is formed only on the upper surface of the p-type contact layer 57, the p-side electrode 59 may also be provided to cover the upper portion of the current blocking layer 58.

A description will be given to a method for fabricating the semiconductor laser device thus constructed with reference to the drawings.

FIGS. 11A to 11E show cross-sectional structures of the semiconductor laser device according to the third embodiment in the individual steps of the fabrication method therefor. In FIG. 11, the same components as shown in FIG. 10 are designated by the same reference numerals.

Figure 11A:
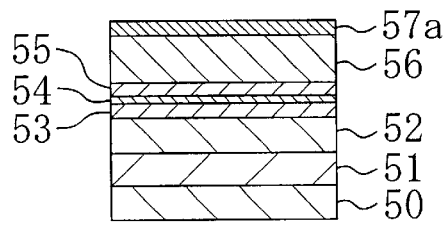
FIGS. 11A to 11E are structural cross-sectional views illustrating the individual process steps of a method for fabricating the semiconductor laser device according to the third embodiment.

First, as shown in FIG. 11A, the n-type buffer layer 51, the n-type cladding layer 52, the n-type optical confinement layer 53, the single quantum well active layer 54 (hereinafter referred to as the active layer 54), the p-type optical confinement layer 55, the p-type cladding layer 56, and a p-type lower contact layer 57a are grown successively on the substrate 50 composed of a gallium nitride by, e.g., MOVPE, thereby forming an epitaxial layer. Since the p-type lower contact layer 57a will be regrown in the subsequent step, the thickness thereof is limited to about 0.3 μm.

Figure 11B:
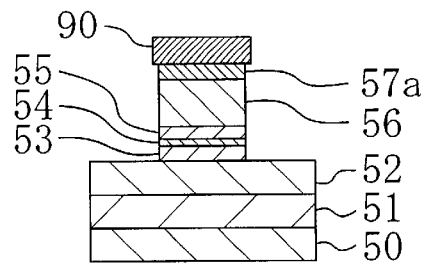

Next, as shown in FIG. 11B, a polysilicon film with a thickness of about 500 nm is deposited on the p-type lower contact layer 57a by, e.g., CVD. Subsequently, a stripe resist pattern (not shown) with a width of about 3 μm is formed by lithography to cover the region of the p-type lower contact layer 57a to be formed with the cavity. By using the formed resist pattern as a mask, dry etching using tetrafluorocarbon as an etching gas is performed with respect to the polysilicon film, thereby forming an anti-oxidant film 90 from the polysilicon film. Subsequently, dry etching using chlorine ($Cl_2$) is performed with respect to the epitaxial layer by using the resist pattern and the anti-oxidant film 90 as a mask till the n-type cladding layer 52 is exposed, thereby forming the ridge portion.

Figure 11C:
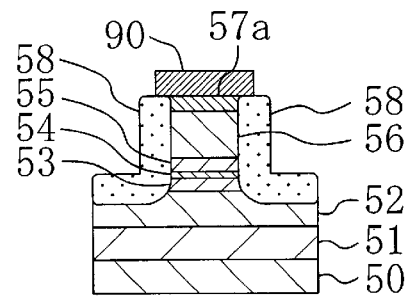

Next, as shown in FIG. 11C, the epitaxial layer is exposed to an oxygen atmosphere at a temperature of about 900° C. and under a pressure of about 1 atm for about 24 hours by using the formed anti-oxidant film 90 as a mask, whereby the upper portion of the n-type cladding layer 52 located on both sides of the ridge portion and the respective portions of the n-type optical confinement layer 53, the active layer 54, the p-type optical confinement layer 55, the p-type cladding layer 56, and the p-type lower contact layer 57a located on both sides of the ridge portion are oxidized. As a result, some of the nitrogen atoms composing the region extending from the p-type lower contact layer 57a to the upper portions of the n-type cladding layer 52 are replaced with oxygen atoms so that the current blocking layer 58 is formed on both dies of the region extending from the p-type lower contact layer 57a to the upper portion of the n-type cladding layer 52.

Figure 11D:
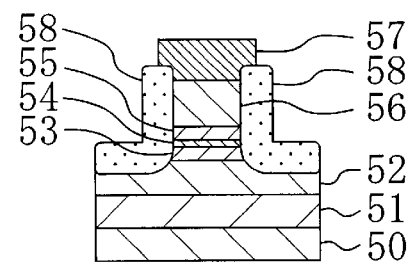

Next, as shown in FIG. 11D, the anti-oxidant film 90 is removed by immersing the epitaxial layer in a buffered hydrofluoric acid. The residual portion of the anti-oxidant film 90 is removed by dry etching using tetrafluorocarbon, while the current blocking layer 58 formed is not etched by the buffered hydrofluoric acid. Subsequently, the p-type lower contact layer 57a is regrown by MOVPE to form the p-type contact layer 57 with a thickness of about 0.5 μm. The p-type contact layer 57 is grown to cover the upper end surfaces of the current blocking layer 58.

Figure 11E:
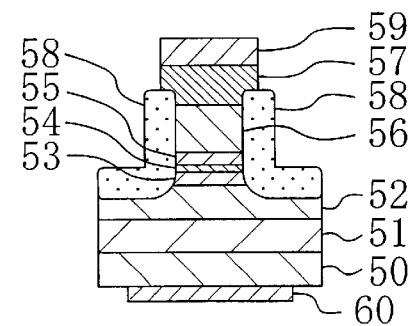

Next, as shown in FIG. 11E, nickel, platinum, and gold are deposited successively by, e.g., vapor deposition in such a manner as to cover the p-type contact layer 57 so that the p-side electrode 59 composed of the resulting multilayer structure is formed selectively. Subsequently, titanium, platinum, and gold are deposited successively on the surface of the substrate 50 opposite to the n-type buffer layer 51 so that the n-side electrode 60 composed of the resulting multilayer structure is formed selectively. In the present embodiment also, the order in which the p-side electrode 59 and the n-side electrode 60 are formed may also be reversed.

Thereafter, the substrate 50 is cleaved such that the cavity has a length of about 500 μm and the emitting surface of the cavity is provided with low reflection coating to have a reflectivity of about 10%, while the reflecting surface of the cavity is provided with high reflection coating to have a reflectivity of about 80%, though the foregoing processes are not depicted.

Thus, in the semiconductor laser device according to the third embodiment and the fabrication method therefor, the current blocking layer 58 is formed from a dielectric material obtained by replacing some of the nitrogen atoms composing the region extending from the n-type cladding layer 52 to the p-type contact layer 57 with oxygen atoms. Accordingly, the adhesion of the current blocking layer 58 to the ridge portion is improved significantly.

In addition, the amount of oxygen contained in the current blocking layer 58 decreases gradually with approach to the active layer 54. This allows the refractive index of the current blocking layer 58 to change continuously and easily optimizes the laser structure.

Moreover, since the n-side electrode 60 is provided on the surface of the substrate 50 opposite to the n-type buffer layer 51 in opposing relation to the p-side electrode 59, a DC resistance component is reduced.

Further, since the p-side electrode 59 is provided over the current blocking layer 58, an alignment step in forming the electrode is no more necessary.

The third embodiment is not only applicable to an edge-emitting laser device but also to a surface-emitting laser device, similarly to the first and second embodiments.

Embodiment 4

A fourth embodiment of the present invention will be described herein below with reference to the drawings.

Figure 12:
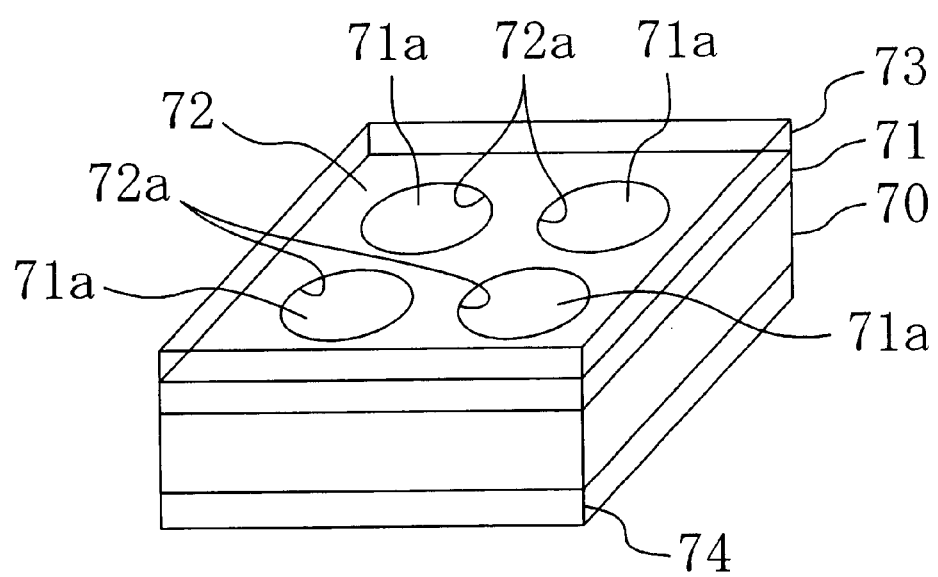
FIG. 12 is a perspective view of an array of blue-light-emitting diode devices according to a fourth embodiment of the present invention.
Figure 13:
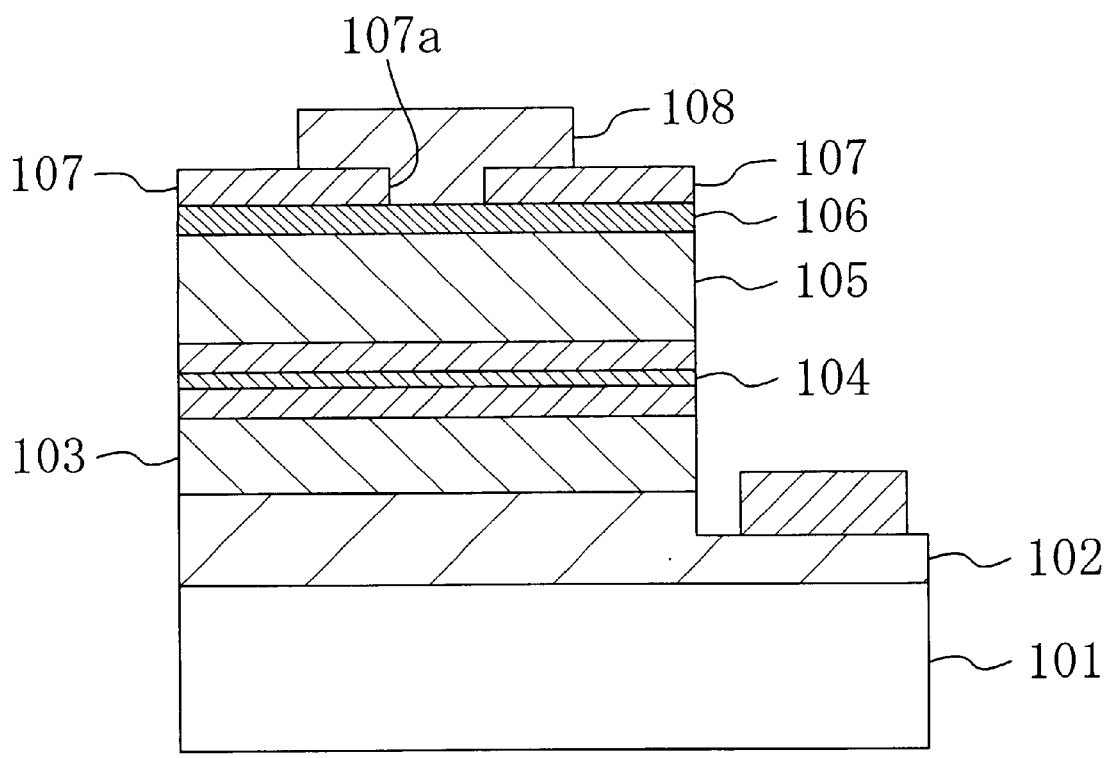
FIG. 13 is a structural cross-sectional view of the conventional semiconductor laser device.

FIG. 12 diagrammatically shows an array of blue-light-emitting diode devices according to the fourth embodiment.

As shown in FIG. 12, an epitaxial layer 71 composed of a double heterostructure equal to that used in the second embodiment is formed on a substrate 70 composed of any of a gallium nitride (GaN), an aluminum gallium nitride (AlGaN), and a silicon carbide (SiN) each having n-type conductivity.

A current blocking layer 72 is formed on the upper surface of the epitaxial layer 71 in such a manner that a p-type contact layer 71a is exposed through four circular openings 72a arranged as a matrix.

The fourth embodiment is characterized in that the current blocking layer 72 is formed from a dielectric material obtained by replacing some of nitrogen atoms composing at least the p-type contact layer 71a with oxygen atoms.

A transparent electrode 73 composed of, e.g., an ITO (Indium Tin Oxide) is formed on the current blocking layer 72 to make an ohmic contact with the p-type contact layer 71a exposed through the openings 72a and transmit recombined light such that output light is retrieved from above the epitaxial layer. An n-side electrode 74 composed of a multilayer structure of titanium, platinum, and gold is formed on the surface of the substrate 70 opposite to the epitaxial layer 71.

It is to be noted that the current blocking layer 72 provides electrical isolation between the individual diode devices.

According to the fourth embodiment, the light can be confined optically to the region under the opening of the current cladding layer 72 in the epitaxial layer 71 since the current blocking layer 72 is lower in refractive index than the epitaxial layer 71.

A multi-layer dielectric film which transmits emission wavelengths may also be provided on the transparent electrode 73. In this case, a so-called surface-emitting laser structure may also be adopted in which a periodic structure having reflectivity against emission wavelengths is provided under the double heterostructure of the epitaxial layer 71 to cause laser oscillation.

Since the fourth embodiment uses the current blocking layer 72 formed by replacing some of nitrogen atoms composing a Group III–V nitride semiconductor with oxygen atoms, similarly to the first embodiment, the reliability of an isolation region is increased significantly compared with the case where the conventional current blocking layer composed of a silicon nitride is used.

Hence, the array of the blue-light-emitting diode devices according to the fourth embodiment offers high reliability even if it is used in tough outdoor environments.

In each of the first to fourth embodiment, the current blocking layer formed by replacing some of nitrogen atoms composing a Group III–V nitride semiconductor with oxygen atoms can achieve similar effects if it is applied to a white light source obtained by exciting a fluorescent material, an optical integrated device, or the like.

What is claimed is:

1. A method for fabricating a semiconductor light-emitting device, the method comprising:

a first step of forming an active layer and a cladding layer on a substrate;

a second step of forming, on the active layer, a semiconductor layer composed of a Group III–V nitride;

a third step of selectively forming, on the semiconductor layer, a mask film for partially masking the semiconductor layer;

a fourth step of oxidizing the semiconductor layer with the mask film formed thereon in an oxidizing atmosphere to form, in the semiconductor layer, a current blocking layer composed of a dielectric material obtained by replacing some of nitrogen atoms composing the semiconductor layer with oxygen atoms; and a fifth step of removing the mask film.

2. The method of claim 1, further comprising, between the third and fourth steps:

a sixth step of patterning the semiconductor layer into a ridge configuration by using the mask.

* * * * *

UNITED STATES PATENT AND TRADEMARK OFFICE
CERTIFICATE OF CORRECTION

| | |
|---|---|
| PATENT NO. | : 6,746,948 B2 |
| APPLICATION NO. | : 10/243711 |
| DATED | : June 8, 2004 |
| INVENTOR(S) | : Ueda, Daisuke et al. |

It is certified that error appears in the above-identified patent and that said Letters Patent is hereby corrected as shown below:

On the title page:

Under Item "(65) Prior Publication Data", add -- US 6,593,193 B2  July 15, 2003 --

Signed and Sealed this

Eleventh Day of July, 2006

JON W. DUDAS
*Director of the United States Patent and Trademark Office*